United States Patent [19]

d'Auria et al.

[11] 3,996,526

[45] Dec. 7, 1976

[54] OPTICAL RADIATION GENERATOR ELECTRICALLY CONTROLLED

[75] Inventors: Luigi d'Auria; Daniel Ostrowsky, both of Paris, France

[73] Assignee: Thomson-CSF, Paris, France

[22] Filed: June 30, 1975

[21] Appl. No.: 592,055

[30] Foreign Application Priority Data

July 5, 1974 France .................. 74.23408

[52] U.S. Cl. .................. 331/94.5 S; 350/96 WG
[51] Int. Cl.² .................................. H01S 3/13
[58] Field of Search ............. 331/94.5; 350/96 WG
357/18;19

[56] References Cited

UNITED STATES PATENTS

| | | | |
|---|---|---|---|
| 3,881,113 | 4/1975 | Rideout et al. | 357/19 |
| 3,898,583 | 8/1975 | Shuey | 331/94.5 |

*Primary Examiner*—William L. Sikes
*Attorney, Agent, or Firm*—Cushman, Darby & Cushman

[57] ABSTRACT

An optical radiation generator, controlled by an input current, comprising a light emissive diode optically coupled to an optical waveguide and a photodiode located close to the radiating surface of the emissive diode for picking off a part of the optical radiation and for delivering a feedback current which is used in a current negative feedback loop. The light emissive diode, the extremity of the waveguide and the photodiode are encased in a transparent material providing optical coupling and mechanical stability.

6 Claims, 4 Drawing Figures

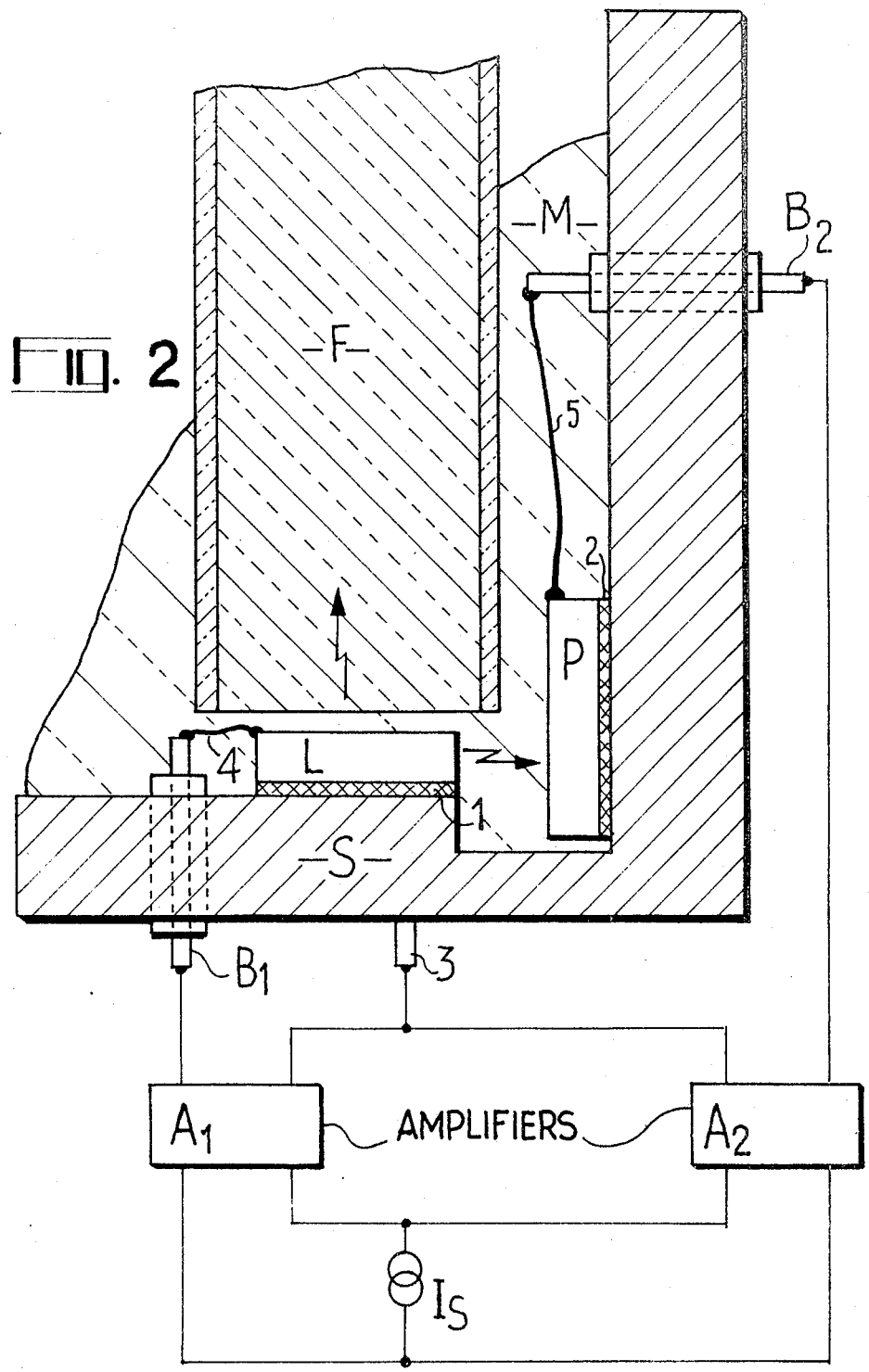

OPTICAL RADIATION GENERATOR ELECTRICALLY CONTROLLED

The present invention relates to optical radiation generator electrically controlled by a control current applied to a light emissive diode. It is well known that the transfer characteristic of this kind of diode, that is to say the radiated power which it emits as a function of the electrical current flowing through it is not a linear function.

The invention seeks to create a simple optical radiation generator which makes it possible to achieve a linear light response as a function of an electrical signal through the utilisation of a current negative feedback loop; this loop can take the form of an integrated circuit.

According to the invention there is provided an optical radiation generator electrically controlled by a control current comprising a pair of input terminals adapted for receiving said control current, a first current amplifier having an input connected to said pair of input terminals and an output, a light emissive diode having a control input connected to the output of said first amplifier and a radiating surface, an optical fiber waveguide having an extremity located close to said radiating surface, a photodiode having a detecting face located close to said radiating surface and an output for delivering a feedback current, said optical fiber waveguide and said photodiode being optically coupled to said radiating surface through a material transparent to said optical radiation, said material encasing said light emissive diode, said extremity of said waveguide and said photodiode, and a second current amplifier having an input coupled to said output of said photodiode and an output coupled to the input of said amplifier.

The invention will be better understood, from a consideration of the ensuing description and related drawings in which:

FIG. 2 and FIG. 3 illustrate two embodiments of the device;

In the various figures, similar references designate similar elements.

Figure 1:
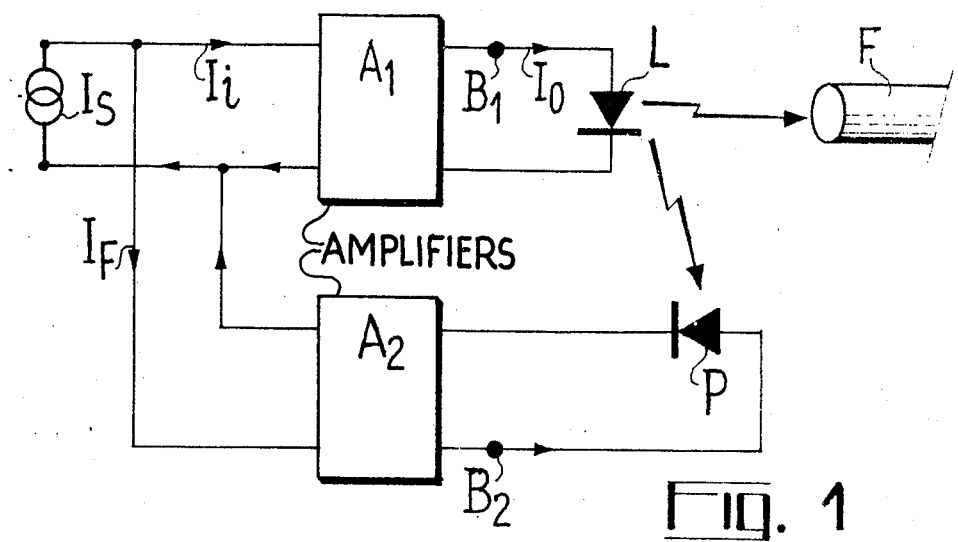
FIG. 1 is an electrical diagram of the device in accordance with the invention.

In FIG. 1, a light emissive diode L has been shown, that is to say a semiconductor p-n junction, which under the control of an electrical current $I_S$ emits radiant energy, normally in the visible part of the spectrum or the near-infra red, the radiation being coherent or incoherent depending upon the type of emissive diode L, and being directed primarily towards an optical fiber F; a photodetector element P, such as a semiconductor diode, is arranged in proximity of the diode L in order to pick off a part of the light signal which the latter emits. The photodiode P is connected by a current amplifier $A_2$ to the input of the device at which the control current $I_S$ for the emissive diode L is received this being symbolised by a current source $I_S$. The light emissive diode L is connected to said input likewise via a current amplifier, the latter being marked $A_1$. The input and output currents to and from the amplifier $A_1$, are marked $I_i$ and $I_o$, respectively, and the output current from the amplifier $A_2$ is marked $I_F$. The output of the amplifier $A_1$ and the input of the amplifier $A_2$ are respectively marked $B_1$ and $B_2$.

In practice, it is invariably the case that the main cause of the non-linearity of the device is the diode L, the non-linearity introduced by the current amplifiers $A_1$ and $A_2$ and the photodiode P, being much less marked.

If we call $P_e$ the optical power emitted by the diode L and $P_d$ the optical power detected by the photodiode P, $\eta$ the sensitivity of P in A/W, $G_2$ the current gain of the amplifier $A_2$ and $\beta$ the negative feedback coefficient, then we obtain the relationship $\beta = (I_F/I_o = G_2 \cdot \eta \cdot (k_2/k_1)$ where $k_2$ is a constant linking the optical powers ($P_d = k_2 P_e$) and $k_1$ is the conversion factor of the diode L ($I_o = k_1 P_e$). It is also possible to define $I_i = I_S - I_F = I_S - G_2 \cdot \eta \cdot P_e \cdot k_2$, as well as a transfer gain $$A = \frac{I_o}{I_i} = \frac{K_1 P_e}{I_S - G_2 \cdot \eta \cdot k_2 \cdot P_e}$$

and a gain with negative feedback, of $$A_F = \frac{I_o}{I_S} = \frac{A}{1 + \beta A}.$$

Thus, a device effecting linear control of a light emissive diode through opto-electronic negative feedback, has been created, which takes account of the set of factors capable of affecting the linearity of the light emission, since the signal picked off for negative feedback purposes is part of the light signal itself, this picking off, furthermore, being something which is capable of being carried out without reducing the efficiency of the system: it is sufficient, to utilise the lateral emission from the diode L, which is not transmitted to the optical fiber as FIG. 2 shows.

FIG. 2 illustrates a sectional view through an embodiment of the device, a diagram of which has been shown in FIG. 1. In the latter figure, there can be seen the light emissive diode L and the photodetector diode P, both attached to a substrate S, and the optical fiber F. The substrate is for example L shaped so that the diode P receives the light energy in a direction substantially normal to the direction of emission from the diode L towards the optical fiber F.

The light emissive diode L is for example a GaAs diode, that is to say a gallium arsenide diode, and the photodetector diode P is a junction formed on a silicon substrate, this type of diode having the dual advantage of possessing the best sensitivity ($\eta$) at the wavelength of the light energy emitted by a GaAs diode, and a very short response time.

By way of example, the device in accordance with the invention has been built using a diode L around 400 $\mu$m in diameter, emitting light energy towards an optical fiber F 500 $\mu$m in diameter, the photodiode P having an area in the order of one square millimeter.

The diodes L and P are attached to the substrate S through the medium of electrically conductive layers, respectively 1 and 2, constituted for example simply by a weld layer; the diodes L and P are thus electrically connected to a common terminal 3 of the substrate S. The diodes L and P are also electrically connected, by respecting connecting wires 4 and 5, to the terminals $B_1$ and $B_2$ which pass through the substrate S.

The optical fiber F is arranged at a short interval from the emissive diode L and held in position by the transparent cementing material M which gives the assembly mechanical stability and effects optical coupling between the elements L, F and P; such a material M could be constituted for example by transparent epoxy resin, for instance optical Araldite (Registered Trade Mark).

The figure is completed by an electrical diagram showing the amplifiers $A_1$ and $A_2$ and the current source $I_S$, connected with one another and with the terminals $B_1$ and $B_2$, as described in FIG. 1.

Figure 3:
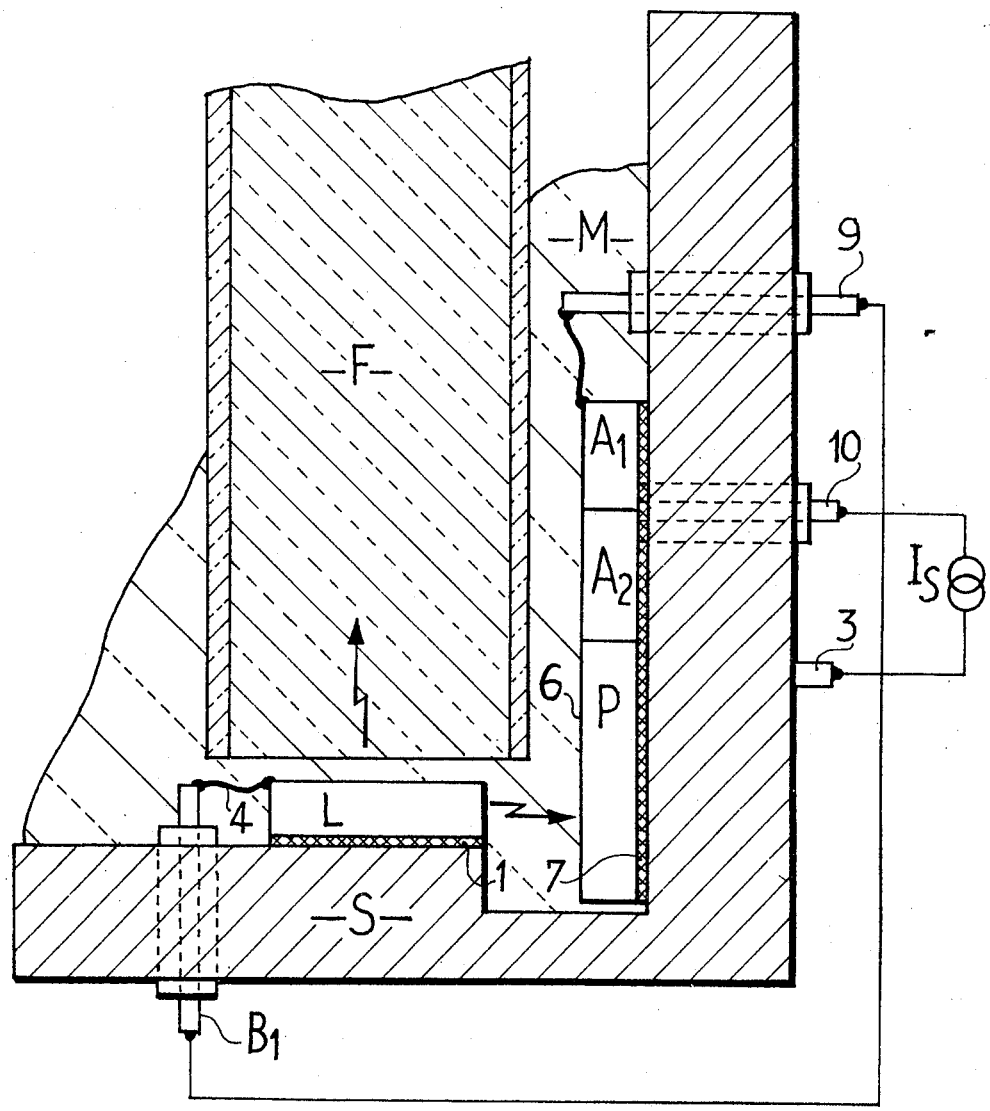

FIG. 3 is a variant embodiment of the preceding figures, in which the photodiode P and the amplifiers $A_1$ and $A_2$ take the form of an integrated circuit on a silicon base, the later schematically illustrated in the figure by a plate 6 split into three sections P, $A_1$ and $A_2$ and arranged on the substrate S in the manner previously described in relation to the photodiode P (FIG. 2).

In this embodiment, the emissive diode L is still connected by the connection 4 to the terminal $B_1$, the diode L and the integrated circuit 6 are connected to the terminal 3 through the medium of the substrate S and conductive layers 1 and 7, the amplifier $A_1$ is connected to a terminal 9 passing through the substrate S and the amplifiers $A_1$ and $A_2$ are connected to a common terminal 10 passing likewise through the substrate S. The amplifiers $A_1$ and $A_2$ and the photodiode P are furthermore connected with one another inside the integrated circuit 6 in accordance with the electrical diagram of FIG. 1. FIG. 3 is supplemented, furthermore, by an electrical diagram linking the amplifier $A_1$ to the emissive diode L and connecting the amplifiers $A_1$ and $A_2$ to the control current $I_S$.

Figure 4:
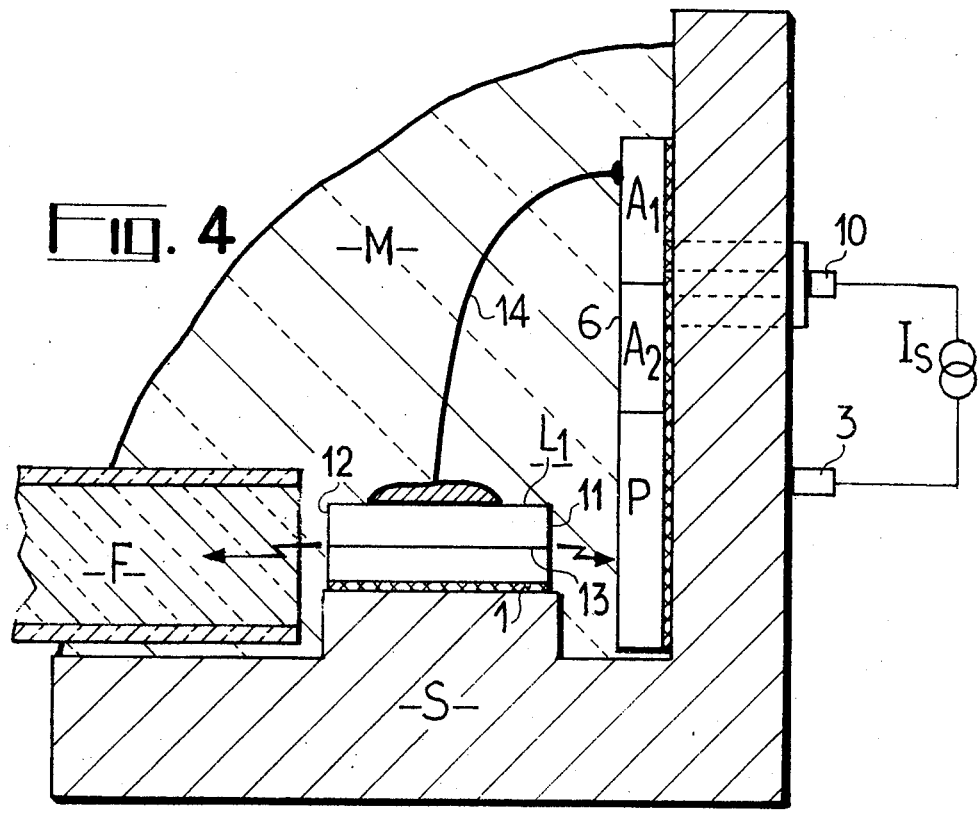
FIG. 4 illustrates a variant embodiment in which the light emissive diode to be controlled, emits coherent radiation.

FIG. 4 illustrates a variant embodiment of the invention in which the light emissive diode to be controlled, emits coherent radiation.

It will be remembered that a diode of this kind, also known as a laser diode and marked $L_1$ in FIG. 4, essentially consists of a p-n junction arranged in an optical resonant cavity; minority charge carriers are injected into the junction by appropriate biasing, with a sufficient density to produce stimulated light emission. The parallel terminal faces of the diode, marked 11 and 12 in the figure perpendicular to the junction plane (13), are polished and constitute an optical resonant cavity in which the emitted coherent wave can oscillate. Opposite the face 12 of the diode $L_1$ the optical fiber F is located. A photosensitive diode P is arranged opposite the face 11 of $L_1$ where the emitted light power and consequently the power $P_d$ detected by the photodiode P, is much greater than in the preceding embodiment: the gain of the amplifier $A_2$ is consequently reduced.

In FIG. 4, the substrate S carrying the laser diode $L_1$ and the integrated circuit 6 have been shown, together with the terminals 3 and 9 and the control current $I_S$, the optical fiber F being in this case located opposite the face 12 of the diode $L_1$ and the amplifier $A_1$ being connected for example directly to the diode $L_1$ through a lead 14. The optical radiation generator in accordance with the invention is particularly significant in this latter embodiment since the characteristic of the light power emitted by a laser diode as a function of the control current, is far from linear.

More generally, the device in accordance with the invention is applicable to the linear electrical control of any radiated energy generator as for example a laser associated with an electro-optical modulator.

What we claim:

1. An optical radiation generator electrically controlled by a control current comprising a pair of input terminals adapted for receiving said control current, a first linear current amplifier having an input connected to said pair of input terminals and an output, a light emissive diode having a control input connected to the output of said first amplifier and a radiating surface emitting said optical radiation, an optical fiber waveguide, for transmitting said optical radiation, having an extremity located close to said radiating surface, a photodiode having a detecting face located close to said radiating surface and an output for delivering a feedback current, said optical fiber waveguide and said photodiode being optically coupled to said radiating surface through a material transparent to said optical radiation, said material encasing said light emissive diode, said extremity of said waveguide and said photodiode, and a second linear current amplifier having an input coupled to said output of said photodiode and an output coupled to the input of said first amplifier.

2. A generator as claimed in claim 1, wherein said photodiode and said second and first current amplifiers take the form of an integrated circuit.

3. A generator as claimed in claim 2, wherein said radiating surface is formed by a main face and at least a further face, said extremity of said waveguide being located close to said main face and said detecting face of said photodiode being located close to said further face.

4. A generator as claimed in claim 2 wherein said light emissive diode is a source of coherent optical radiation.

5. A generator as claimed in claim 4, wherein said main face and said further face are parallel.

6. A generator as claimed in claim 5 wherein said optical fiber waveguide comprises one optical fiber with a plane extremity.

* * * * *